United States Patent
Nien et al.

(10) Patent No.: US 12,444,893 B2
(45) Date of Patent: Oct. 14, 2025

(54) OPTIMIZED CABLE SOLUTION

(71) Applicant: Hewlett Packard Enterprise Development LP, Spring, TX (US)

(72) Inventors: Ku-Hsu Nien, Taipei (TW); Vincent Nguyen, Houston, TX (US); Kuan-Wei Chen, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 418 days.

(21) Appl. No.: 18/140,476

(22) Filed: Apr. 27, 2023

(65) Prior Publication Data

US 2024/0364062 A1     Oct. 31, 2024

(51) Int. Cl.
*H01R 31/06*     (2006.01)
*H05K 1/18*      (2006.01)

(52) U.S. Cl.
CPC .............. *H01R 31/06* (2013.01); *H05K 1/18* (2013.01); *H05K 2201/10189* (2013.01); *H05K 2201/10356* (2013.01); *H05K 2201/10522* (2013.01)

(58) Field of Classification Search
CPC . H01R 31/06; H05K 1/18; H05K 2201/10189
USPC ......................................................... 361/785
See application file for complete search history.

(56) References Cited

U.S. PATENT DOCUMENTS

| | | |
|---|---|---|
| 9,015,542 B2 | 4/2015 | Jones et al. |
| 10,007,634 B2 | 6/2018 | Dubal et al. |
| 10,140,238 B2 | 11/2018 | Mundt et al. |
| 10,409,756 B2 | 9/2019 | Zhao et al. |
| 10,879,686 B2 | 12/2020 | Mondal et al. |
| 10,996,724 B2 | 5/2021 | Koenen et al. |
| 11,003,613 B2 | 5/2021 | Escamilla et al. |
| 2004/0047570 A1* | 3/2004 | Lo ..................... G02B 6/3897 385/92 |
| 2015/0022990 A1* | 1/2015 | French, Jr .............. H05K 3/368 361/792 |
| 2020/0412558 A1 | 12/2020 | Ballard et al. |
| 2021/0286744 A1 | 9/2021 | Norton et al. |
| 2022/0229798 A1 | 7/2022 | Lambert et al. |

* cited by examiner

*Primary Examiner* — Andargie M Aychillhum
(74) *Attorney, Agent, or Firm* — Yao Legal Services, Inc.

(57) ABSTRACT

A cable system includes a printed circuit board (PCB) comprising a set of connector pin pads and a card-side connector, with the card-side connector comprising a housing attached to the PCB and a set of pins. A first subset of the set of pins is soldered on and electrically coupled to the connector pin pads. The cable system includes first and second cables electrically coupled to the card-side connector. The first cable includes a first end soldered onto the connector pin pads to couple to the first subset of the pins and a second end coupled to a first host-side connector. The second cable includes a first end soldered onto a second subset of the set of pins of the card-side connector and a second end coupled to a second host-side connector, thereby facilitating electrical coupling between the card-side connector and the first and second host-side connectors.

20 Claims, 9 Drawing Sheets

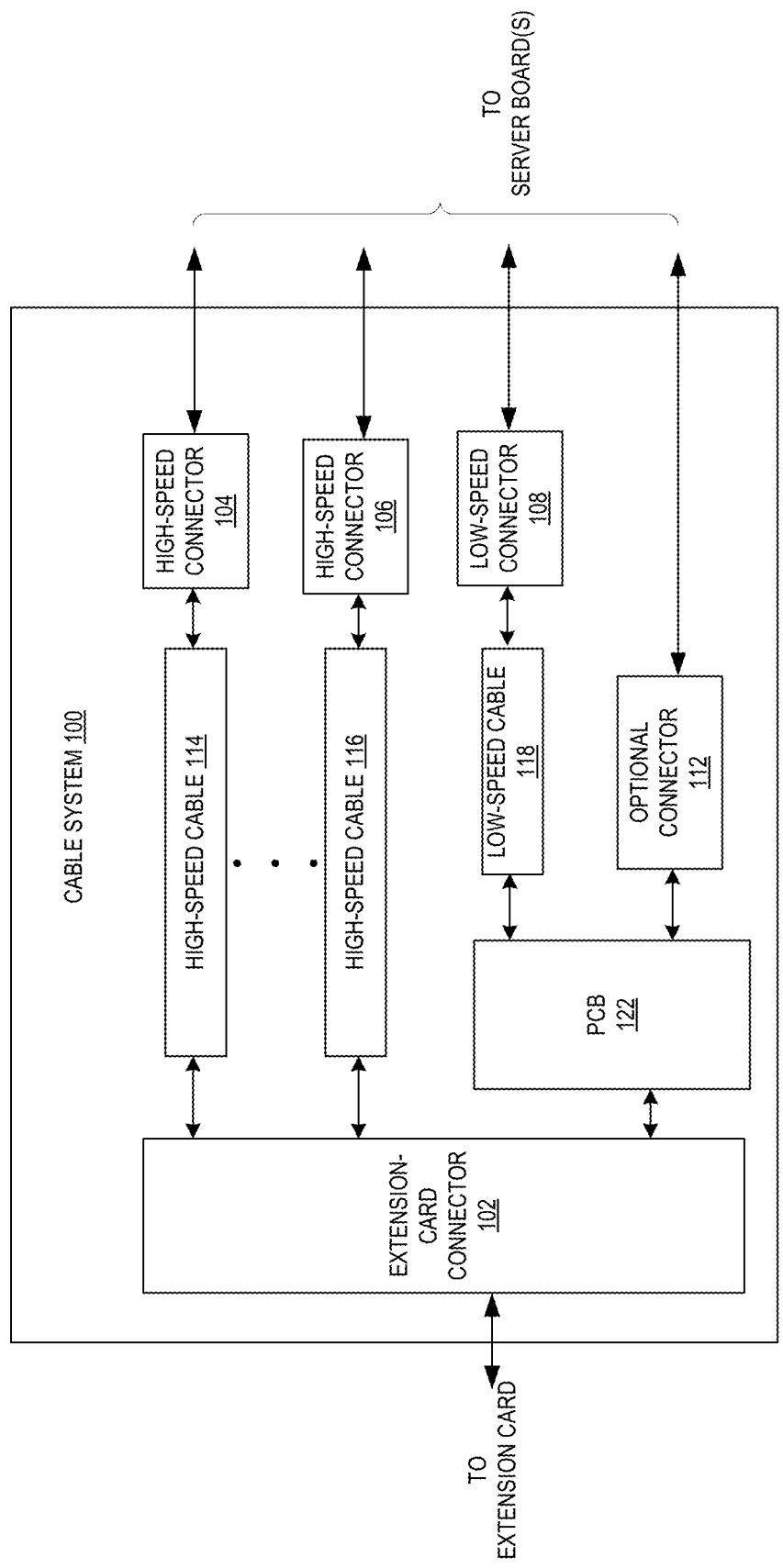

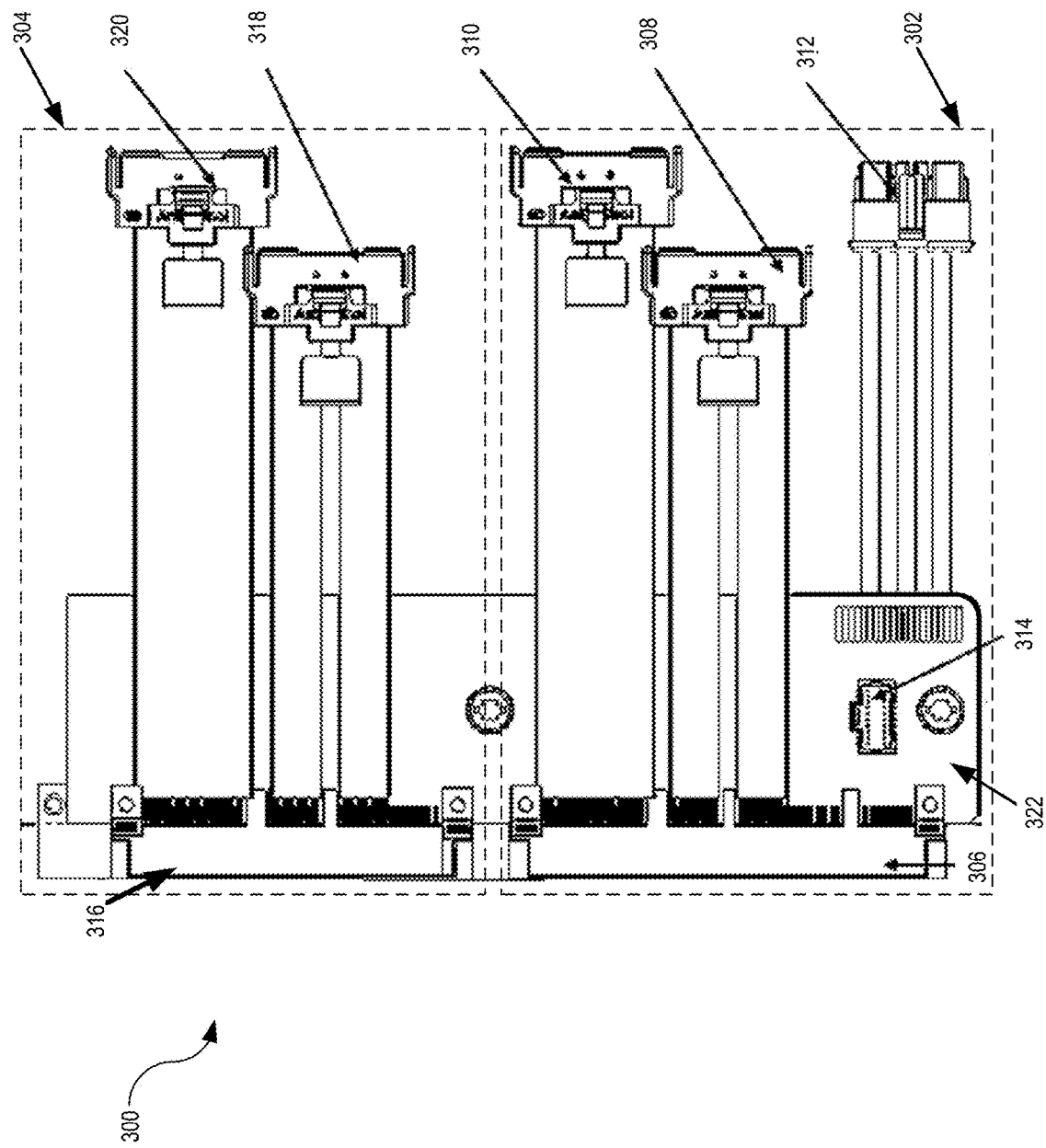

OPTIMIZED CABLE SOLUTION

BACKGROUND

Field

This disclosure is generally related to the design of a cable system. More specifically, this disclosure is related to a cable system that can support different types of extension cards.

BRIEF DESCRIPTION OF THE FIGURES

FIG. 1 illustrates the block diagram of a cable system example, according to one aspect of the instant application.

FIG. 3 illustrates an implementation example of the cable system, according to one aspect of the instant application.

In the figures, like reference numerals refer to the same figure elements.

DETAILED DESCRIPTION

Figure 2A:
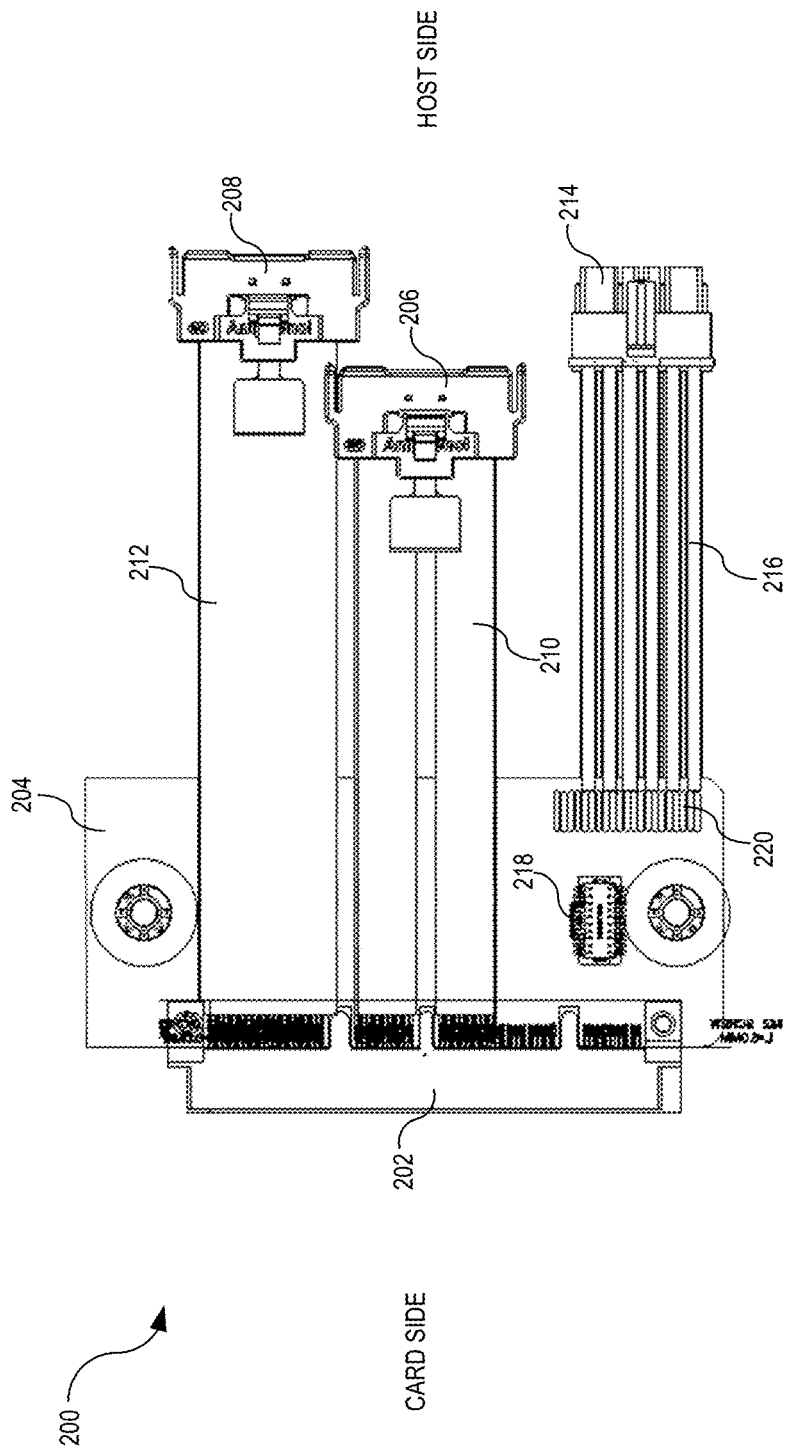
FIG. 2A illustrates an implementation example of the cable system, according to one aspect of the instant application.

The Open Compute Project (OCP) is a collaborative initiative that aims to design and share open-source hardware designs for data center infrastructure. The OCP can provide many benefits to data center operators, hardware vendors, and end-users, such as cost saving, flexibility and scalability, energy efficiency, and vendor neutrality.

Various OCP form factors have been defined for different types of data center hardware, such as Open Rack, Open Vault, Open CloudServer, Open Accelerator Module, OCP Network Interface Card (NIC), Open Networking, etc. These form factors can provide standardized designs for hardware components that are optimized for efficiency, scalability, and flexibility.

The OCP standards allow multiple nodes (or server boards) to be housed in a single physical enclosure (i.e., a chassis), with each node possibly including multiple CPU sockets. Accordingly, an expansion card conforming to an OCP form factor (e.g., a NIC card, a storage controller card, or an accelerator card) may need to connect to multiple nodes or sockets. Moreover, in different chassis/system configurations, the OCP expansion card may need to be placed in different locations, thus making cabling between the expansion card and the server node(s) a challenge. In addition, there are thermal concerns when the cable density is high within the server chassis. Custom-designed cable solutions (e.g., custom-designed cable connectors) have been used to address thermal concern and provide flexibility regarding the locations of the expansion cards. However, those custom-designed cable solutions may increase cost, add design complexity, and occupy more space which is critical in dense board design. Moreover, different types of expansion cards may have different cabling needs. For example, unlike a NIC that requires a Reduced Media Independent Interface (RMII)-based transport (RBT) bus connection, a storage controller or accelerator card in the OCP form factor may not need to cable all the signals from the server node. Connecting unnecessary cables may lead to additional cable costs, increased power consumption, and worse thermal condition.

To solve the aforementioned problems, this disclosure describes a cable solution that can leverage existing connectors on the server boards. A unified cable system can be provided to connect any expansion card conforming to a particular form factor (e.g., an OCP form factor). The cable system can use separate cables to support the multi-node, multi-socket server design. More specifically, the cable system can include an expansion card connector for coupling between an expansion card and multiple cables. Each cable can include one end coupled to the expansion card connector and the other end coupled to a cable connector of a predetermined form factor such that it can be mated to an existing connector on the server board. The cable system can include multiple cables each having a high-speed connector (e.g., a connector conformed to a cable standard for delivering high-speed data) and one cable having a low-speed connector (e.g., a cable conformed to a cable standard for delivering power and sideband-management signals). Moreover, the cable system can include a printed circuit board (PCB) to allow a cable connector to mount on the PCB and to be coupled to the expansion card connector via connector pin pads and/or metal traces on the PCB. An optional cable can be connected to the connector mounted on the PCB as needed to reduce cost and thermal impact. To improve the signal integrity for high-speed data, the cables with the high-speed connector can be directly soldered onto the corresponding pins of the expansion card connector. The cable with the low-speed connector can be soldered onto connector pin pads on the PCB and coupled to the expansion card connector via the connector pin pads and metal traces.

FIG. 1 illustrates the block diagram of an example of the cable system, according to one aspect of the instant application. Cable system 100 can provide cabling between an expansion card and one or more server boards. In the example shown in FIG. 1, Cable system 100 can include a card-side connector (i.e., expansion card connector 102) for interfacing with the expansion card and a number of host-side connectors for interfacing with the server board(s). The host-side connectors for interfacing with the server board(s) can include a number of high-speed connectors (e.g., high-speed connectors 104 and 106), a low-speed connector 108, and an optional connector 112.

Each high-speed connector can be coupled to expansion card connector 102 via a high-speed cable. For example, high-speed connector 104 can be coupled to expansion card connector 102 via a high-speed cable 114, and high-speed connector 106 can be coupled to expansion card connector 102 via a high-speed cable 116. These high-speed cables and connectors can carry high-speed signals exchanged between the server board(s) and the expansion card, which can be a storage controller, a NIC, an accelerator card, etc. The expansion card can conform to a particular form factor that defines and prescribes the size and shape of the card and the connectors on the card. In one aspect, the expansion card can conform to a first form factor with a smaller width (e.g., 76 mm as defined by the OCP small form factor (SFF)). In an alternative aspect, the expansion card can conform to a second form factor with a larger width (e.g., 139 mm as defined by the OCP large form factor (LFF)). The high-speed connectors can be coupled to corresponding high-speed ports on the server board(s). Note that the high-speed ports on the server board(s) can conform to the same pinout, and there is a mechanism to map flexible input/output pins for different use cases. According to some aspects, the high-speed connectors may transmit and receive Peripheral Component Interconnect Express (PCI-e) 5.0 signals.

High-speed storage or networking ports on a server board may include Mini Cool Edge 10 (MCIO) connectors with pinout complying with a predetermined open standard specification, such as the Storage Networking Industry Association (SNIA) Small Form Factor (SFF)-9402 specification or the Data Center—Modular Hardware System (DC-MHS) Modular Hardware System Extensible I/O (M-XIO) specification. To leverage these existing connectors, according to some aspects, high-speed connectors 104 and 106 in cable system 100 can be MCIO connectors with pinout complying with the SNIA SFF-9402 or DC-MHS M-XIO specification.

In some examples, each high-speed cable can include a ribbon cable. One end of a high-speed cable can terminate at a corresponding high-speed connector using known techniques (e.g., insulation-displacement contact (IDC)). In the example shown in FIG. 1, one end of high-speed cable 114 can be terminated by high-speed connector 104, and the number of wires in high-speed cable 114 may or may not match the number of contact pins in high-speed connector 104. For example, high-speed connector 104 may have 74 pins, whereas high-speed cable 114 may only have 56 wires coupled to a subset of the 74 pins. In another example, high-speed cable 114 may also have 74 wires coupled to all 74 pins of high-speed connector 104. Note that the number of wires in each high-speed cable can be much smaller than the number of contact pins in expansion card connector 102. More specifically, the wires (or a subset of wires) of each high-speed cable are only coupled to a subset of the pins of expansion card connector 102. To preserve the integrity of the high-speed signals (e.g., signals with a speed of PCIe 5.0 or beyond), according to some aspects, conducting wires of each high-speed cable can be directly connected to pins of expansion card connector 102. In one example, the conducting wires of each high-speed cable can be directly soldered onto the corresponding pins of expansion card connector 102.

Low-speed connector 108 can be coupled to expansion card connector 102 via low-speed cable 118. Like the high-speed cables terminating at the high-speed connectors, low-speed cable 118 can terminate at low-speed connector 118. The number of wires in low-speed cable 118 may or may not match the number of contact pins in low-speed connector 108. Because the low-speed cable and connector carry low-speed signals, there is less concern about signal degradation and, hence, there is no need for direct coupling between low-speed cable 118 and expansion card connector 102. According to some aspects, low-speed cable 118 can be coupled to expansion card connector 102 via connector pin pads and metal traces and one or more optional circuit components on printed circuit board (PCB) 122. In one example, a subset of contact pins of expansion card connector 102 can be coupled to a number of contact pads on PCB 122 via metal traces, and conducting wires of low-speed cable 118 can be coupled to those contact pads to establish an electrical coupling between low-speed connector 108 and expansion card connector 102. In addition to metal traces, certain circuit components may also be formed on PCB 122 to modify the signals (e.g., by filtering) exchanged between expansion card connector 102 and low-speed connector 108.

According to some aspects, low-speed connector 108 can be coupled to a power and sideband management port on a server board to deliver power to the expansion card. According to one aspect, the power and sideband management port on the server board may include a connector with a pinout complying with a predetermined open standard specification, such as the DC-MHS Modular Hardware System Platform Infrastructure Connectivity (M-PIC) specification, which specifies common elements needed to interface a Host Processor Module (HPM) to the platform/chassis infrastructure elements/subsystems. Accordingly, low-speed connector 108 can be an M-PIC connector with a pinout complying with the DC-MHS M-PIC specification. According to one aspect, the expansion card can conform to an OCP form factor, and the DC-MHS M-PIC signals may need to be transformed to comply with the OCP standard before they can be sent to the expansion card via expansion card connector 102. In such a situation, PCB 122 can include a number of circuit components that can receive the M-PIC signals from a low-speed cable, transform the M-PIC signals to OCP signals, and send the transformed signals to expansion card connector 102.

Optional connector 112 can also be coupled to expansion card connector 102 via metal traces on PCB 122. For example, a subset of contact pins of expansion card connector 102 can be coupled to a number of metal traces on PCB 122, and contact pins of optional connector 112 can also be coupled to those metal traces to establish an electrical coupling between optical connector 112 and expansion card connector 102. According to some aspects, optional connector 112 can include a vertical receptacle such that one can connect a cable by inserting a matching connector into the receptacle from above. Note that optional connector 112 is connected only when needed. Optional connector 112 can have various form factors depending on the need. In one example, optional connector 112 can include a connector that supports the RBT bus connection between a smart NIC and the baseboard management controller (BMC) Network Communication Services Interface (NCSI) on the server board.

As discussed previously, expansion card connector 102 can be used to interface with an expansion card conformed to an OCP form factor, such as a small form factor (SFF) OCP card or a large form factor (LFF) OCP card. According to some aspects, to interface with an SFF OCP card, expansion card connector 102 can include a 4C+ connector that complies with the open standard OCP NIC 3.0 specification. To interface with an LFF OCP card, expansion card connector 102 can include a 4C+ connector and a 4C connector, with both connectors complying with the open standard OCP NIC 3.0 specification.

FIG. 2A illustrates an implementation example of the cable system, according to one aspect of the instant application. In this example, a cable system 200 can be used to interface between an SFF OCP card and one or more server boards and can include an expansion card connector 202, a PCB 204, high-speed connectors 206 and 208, high-speed cables 210 and 212, a low-speed connector 214, a low-speed cable 216, and an optional connector 218.

Figure 2B:
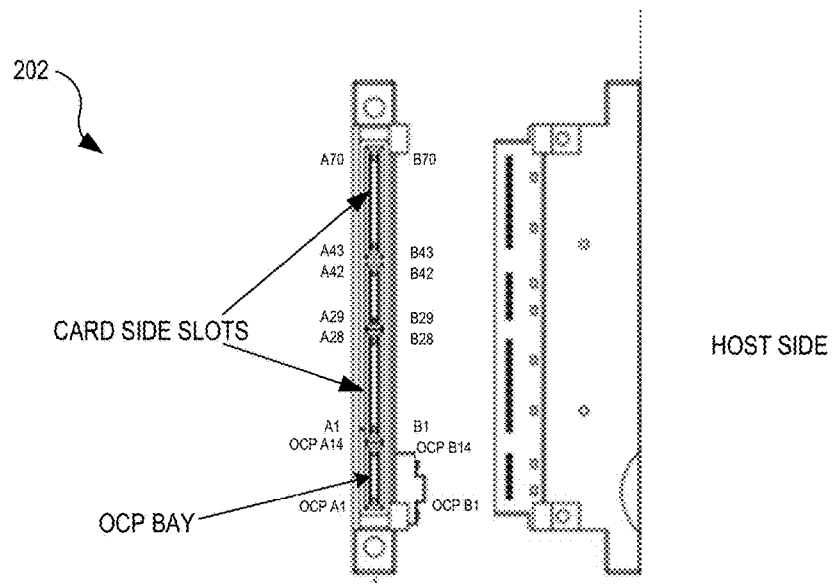
FIG. 2B illustrates in more detail an example of the housing of the expansion card connector.

In the example shown in FIG. 2A, expansion card connector 202 can be a straddle-mount connector mounted on one edge of PCB 204. According to some aspects, expansion card connector 202 can be a 4C+ connector, with the host side facing PCB 204 and the card side facing a to-be-connected expansion card. FIG. 2B illustrates in more detail an example of the housing of expansion card-connector 202. The left drawing shows the side view of the connector housing when viewed from the card side. More specifically, expansion card-connector 202 can include a number of slots of predetermined sizes to allow a card complying with the SFF OCP standard to couple to expansion card-connector 202 by inserting corresponding edge portions into the slots. The right drawing shows the top view of the connector housing. In this example, expansion card connector 202 can include an OCP bay with 28 pins for carrying the NIC-sideband signals and 140 other pins. A more detailed description of a 4C+ connector can be found in the OCP NIC 3.0 specification and will not be repeated here.

Figure 2C:
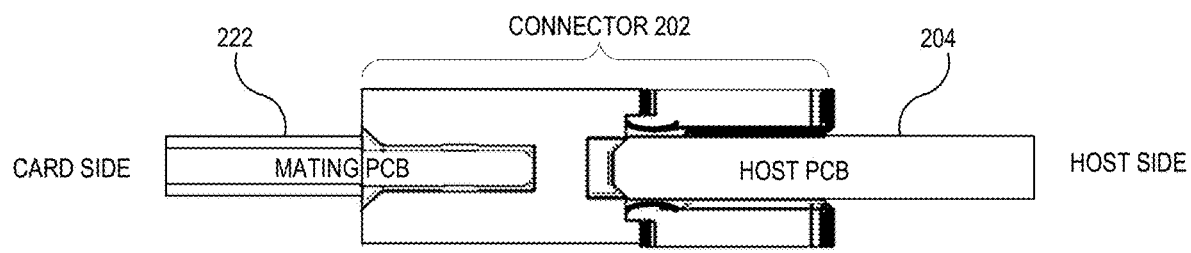
FIG. 2C illustrates the cross-sectional view of an example expansion card connector.

FIG. 2C illustrates the cross-sectional view of expansion card connector 202. FIG. 2C shows that an edge of PCB 204 is inserted into the housing of expansion card connector 202 from the host side. Similarly, an edge of a mating PCB 222 (e.g., the expansion card) can be inserted into the housing of expansion card connector 202 from the card side.

Returning to FIG. 2A, on the host side, the contact pins of expansion card connector 202 can be arranged into a single array and positioned above PCB 204 such that electrical connections to expansion card connector 202 can be achieved by establishing electrical connections to these pins. High-speed connectors 206 and 208 can be similar and can each include an MCIO connector with a pinout complying with the SNIA SFF-9402 or DC-MHS M-XIO specification. In one example, each high-speed connector can include 74 pins. Each high-speed cable can include 74 or fewer conducting wires, with one end of the cable coupled to a corresponding high-speed connector and the other end of the cable coupled to a subset of contact pins of expansion card connector 202. To preserve the integrity of the high-speed signals (e.g., PCIe 5.0 signals), the conducting wires of high-speed cables 210 and 212 can be soldered directly onto the contact pins of expansion card connector 202. For example, the conducting wires of high-speed cable 210 can be soldered onto pins A43-A70 and B43-B70 of expansion card connector 202, and the conducting wires of high-speed cable 212 can be soldered onto pins A15-A42 and B115-B42.

Low-speed connector 214 can be an M-PIC connector with a pinout complying with the DC-MHS M-PIC specification. In one example, low-speed cable 216 can include a ribbon cable with a plurality of conducting wires. In another example, low-speed cable 216 can include a plurality of discrete cables. In one example, low-speed connector 214 can include 30 pins, and the number of conducting wires in low-speed cable 216 can be 30 or less. One end of low-speed cable 216 can terminate at low-speed connector 214, whereas the other end of low-speed cable 216 can terminate at a plurality of connector pin pads 220 on PCB 204. Although not shown in FIG. 2A, connector pin pads 220 can be coupled to a subset of pins of expansion card connector 202 via a plurality of metal traces on PCB 204, such that low-speed connector 214 can be coupled to expansion card connector 202. In one example, connector pin pads 220 can be coupled to pins A1-A14 and B1-B14 of expansion card connector 202. Note that the metal traces can be formed on the top layer or an intermediate layer of PCB 204.

Although not shown in FIG. 2B, PCB 204 can also include one or more circuit components that can transform the DC-MHS M-PIC signals coming from low-speed connector 214 into signals that comply with the OCP standard before sending such signals to an expansion card via expansion card connector 202. Similarly, these circuit components can transform OCP signals into DC-MHS M-PIC signals.

Optional connector 218 can be directly mounted on PCB 204 and can be electrically coupled to expansion card connector 102 via metal traces (not shown in FIG. 2A) on PCB 204. In one example, optional connector 218 can be coupled to pins A1-A14 and B1-B14 in the OCP bay of expansion card connector 202 (as shown in FIG. 2B). A mating cable can be plugged into optional connector 218 as needed. For example, if cable system 200 is used to connect a storage controller or an accelerator card to the server board(s), optional connector 218 can be left unconnected. On the other hand, if cable system 200 is used to connect a NIC card to the server board(s), a cable can be plugged into optional connector 218 to provide the RBT bus connection between the NIC card and a server BMC NCSI interface. This way, the total number of cables inside the server chassis can be reduced.

FIG. 3 illustrates an implementation example of the cable system, according to one aspect of the instant application. More specifically, FIG. 3 shows a cable system 300 for interfacing between an LFF OCP expansion card and one or more server boards. Cable system 300 can include a primary cable system 302 and a secondary cable system 304.

According to some aspects, primary cable system 302 can be similar to cable system 200 shown in FIG. 2A and can include a primary expansion card connector 306 mounted on an edge of a PCB 322 for interfacing with the expansion card and a number of host-side connectors for interfacing with the server board(s), such as high-speed connectors 308 and 310, a low-speed connector 312, and an optional connector 314. Primary cable system 302 can further include a number of cables for coupling the high-speed and low-speed connectors to primary expansion card connector 306. Like the example shown in FIG. 2A, primary expansion card connector 306 can include a 4C+ connector complying with the OCP NIC 3.0 specification, high-speed connectors 308 and 310 can include MCIO connectors with a pinout complying with the SNIA SFF-9402 or DC-MHS M-XIO specification, and low-speed connector 312 can include an M-PIC connector with a pinout complying with the DC-MHS M-PIC specification. In one example, each of the high-speed connectors can include 74 contact pins, and low-speed connector 312 can include 30 contact pins. Like the example shown in FIG. 2A, the cables coupling the high-speed connectors to primary expansion card connector 306 can be directly soldered onto a subset of pins of primary expansion card connector 306 to preserve the integrity of the high-speed signals. The cable coupling low-speed connector 312 to primary expansion card connector 306 can be coupled to a number of metal traces (not shown in FIG. 3) on PCB 322. Optional connector 314 can also be coupled to primary expansion card connector 306 via metal traces (not shown in FIG. 3) on PCB 322.

Secondary cable system 304 can include a secondary expansion card connector 316 mounted on the same edge of PCB 322 as primary expansion card connector 306. Note that a corresponding edge of an LFF OCP card can include a number of fingers to be plugged into the slots provided by primary expansion card connector 306 and secondary expansion card connector 316. Secondary cable system 304 can further include high-speed connectors 318 and 320 for interfacing with the server board(s). According to some aspects, secondary expansion card connector 316 can include a 4C connector complying with the OCP NIC 3.0 specification. High-speed connectors 318 and 320 can be similar to high-speed connectors 308 and 310 and can include MCIO connectors with a pinout complying with the SNIA SFF-9402 or DC-MHS M-XIO specification.

In the example shown in FIG. 3, the same PCB (i.e., PCB 322) provides support to primary expansion card connector 306 and secondary expansion card connector 316, and low-speed connector 312 and optional connector 314 are also coupled to PCB 322. According to alternative aspects, primary expansion card connector 306 and secondary expansion card connector 316 can be supported by two different PCBs. In such a situation, optional connector 314 can be mounted on the PCB supporting primary expansion card connector 306, because it is electrically coupled to the OCP bay in primary expansion card connector 306. On the other hand, low-speed connector 312 can be coupled to metal traces on either PCB. In one example, low-speed connector 312 can be coupled to metal traces on the PCB supporting primary expansion card connector 306.

By dividing the contact pins of the expansion card connector into multiple subsets and allowing the different subsets of pins to be coupled to different cable connectors via separate cables, the proposed cable solution can provide the connection flexibility required by the multi-node server system. The expansion card can be placed anywhere in the server chassis, and the expansion card can be connected to a single socket, multiple sockets on the same server board, or multiple sockets on different server boards. Moreover, the same cable system can support different types of expansion cards without the need to connect unnecessary cables.

Figure 4A:
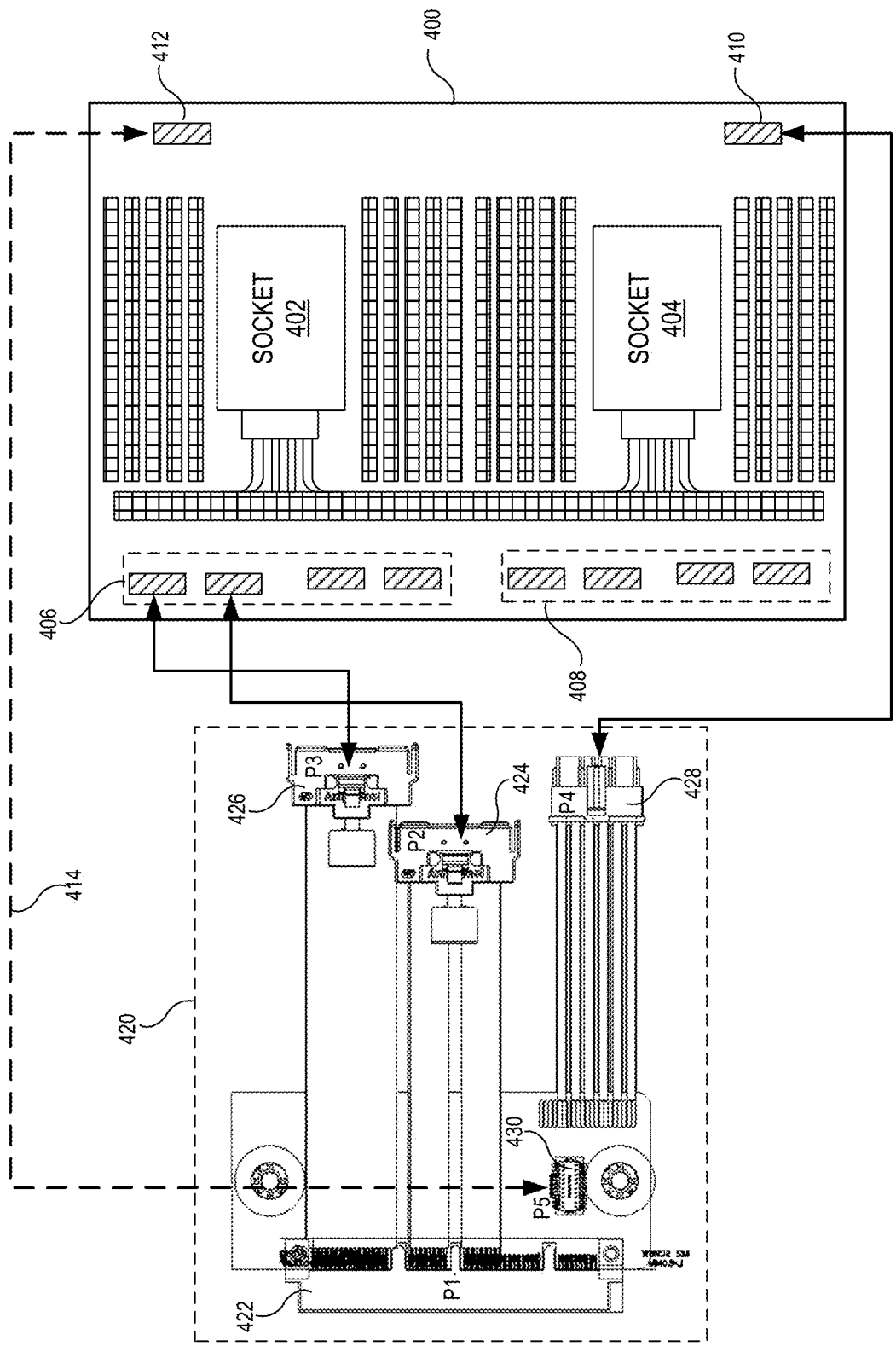
FIG. 4A illustrates an example of the coupling between the cable system and a server board, according to one aspect of the instant application.

FIG. 4A illustrates an example of the coupling between the cable system and a server board, according to one aspect of the instant application. In FIG. 4A, a server board 400 is shown as having a pair of sockets 402 and 404. Each socket can be coupled to a number of high-speed data ports for interfacing with expansion cards, such as storage controllers, accelerator cards, NIC cards, etc. The expansion cards can conform to a particular form factor (e.g., the OCP SFF). In this example, socket 402 can be coupled to a port group 406 comprising a number of high-speed data ports, and socket 404 can be coupled to a port group 408 comprising a number of high-speed data ports. Server board 400 can also include a power and sideband management port 410 and an RBT port 412. According to some aspects, the high-speed data ports in port groups 406 and 408 can include MCIO connectors with a pinout complying with the SNIA SFF-9402 or DC-MHS M-XIO specification, and power and sideband management port 410 can include an M-PIC connector with a pinout complying with the DC-MHS M-PIC specification. In addition to the above ports, server board 400 can also include other components that may be needed for the operation of the processors, such as memory bays, other types of input/output ports, etc., which will not be described in detail.

FIG. 4A also shows a cable system 420 that includes an expansion card connector 422 (denoted as P1), high-speed connectors 424 and 426 (denoted, respectively, as P2 and P3), a low-speed connector 428 (denoted as P4), and an optional connector 430 (denoted as P5). Cable system 420 can be similar to cable system 200 shown in FIG. 2A.

In the example shown in FIG. 4A, high-speed connectors 424 and 426 (or P2 and P3) can be connected to a pair of high-speed data ports belonging to socket 402 and low-speed connector 428 can be connected to power and sideband management port 410. More specifically, each connector may be directly plugged into the corresponding port. Moreover, optional connector 430 can be connected to RBT port 412 via an optional cable 414. Note that depending on the placement of the to-be-connected expansion card with respect to server board 400, the length of the cable between expansion card connector 422 and each individual host-side connector (i.e., connector 424, 426, or 428) may vary. Optional cable 414 is only needed when the expansion card is a smart NIC card.

Because both high-speed connectors P2 and P3 of cable system 420 are coupled to ports belonging to socket 402, the expansion card coupled to cable system 420 will only be connected to socket 402. In other words, FIG. 4A shows a card-to-single-socket cable connection scenario.

Figure 4B:
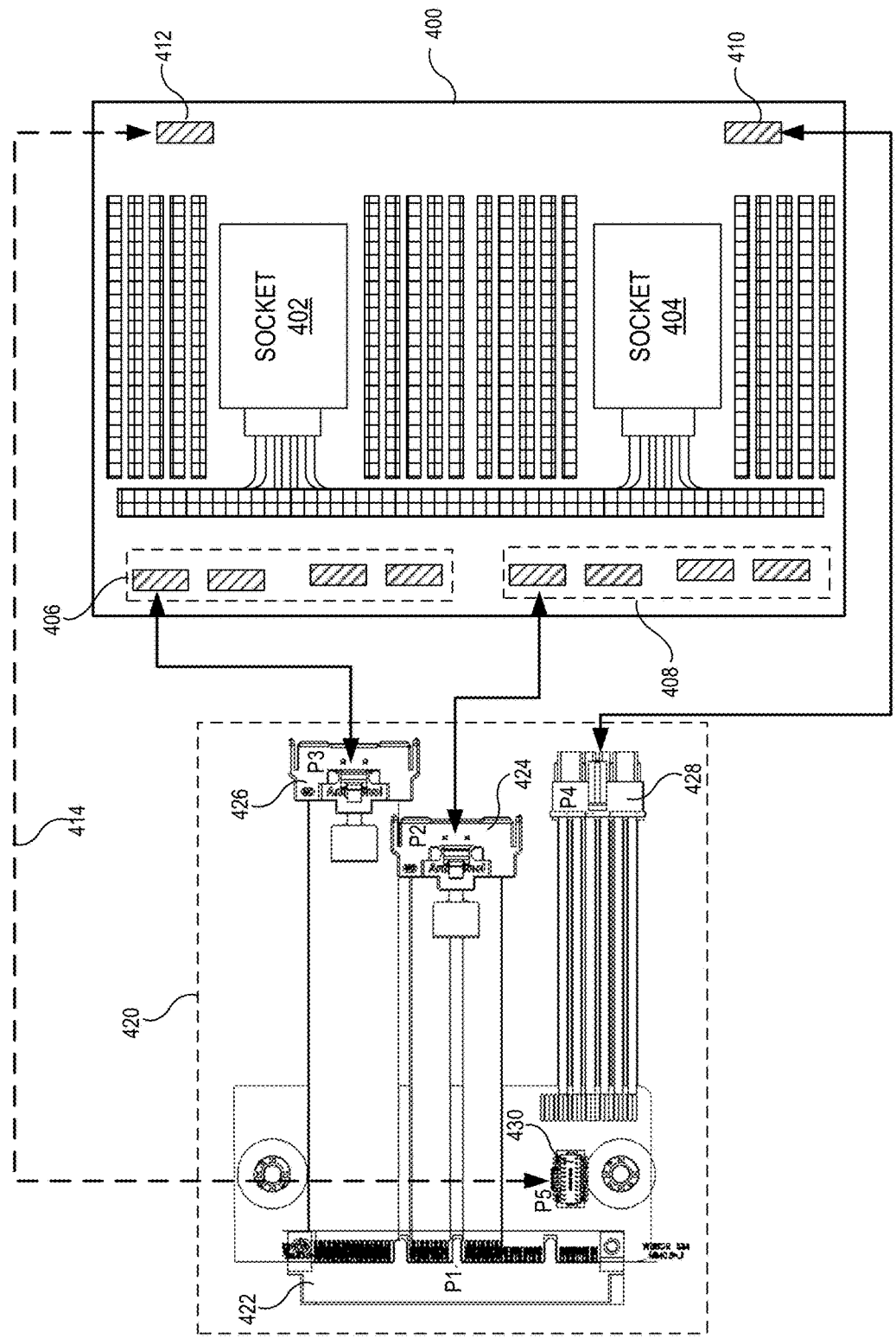
FIG. 4B illustrates an example of the coupling between the cable system and a server board, according to one aspect of the instant application.

FIG. 4B illustrates an example of the coupling between the cable system and a server board, according to one aspect of the instant application. In FIG. 4B, server board 400 and cable system 420 can be the same as those shown in FIG. 4A. Like in FIG. 4A, high-speed connector 426 or P3 is coupled to a high-speed data port belonging to socket 402, low-speed connector 428 or P4 is coupled to power and sideband management port 410, and optional connector 430 may be coupled to RBT port 412 via an optional cable 414. However, the other high-speed connector 424 or P2 is now coupled to a high-speed data port belonging to a different socket 404. This way, the same expansion card may be connected to two different sockets via cable system 420. FIG. 4B shows a card-to-multiple-sockets cable connection scenario.

Figure 4C:
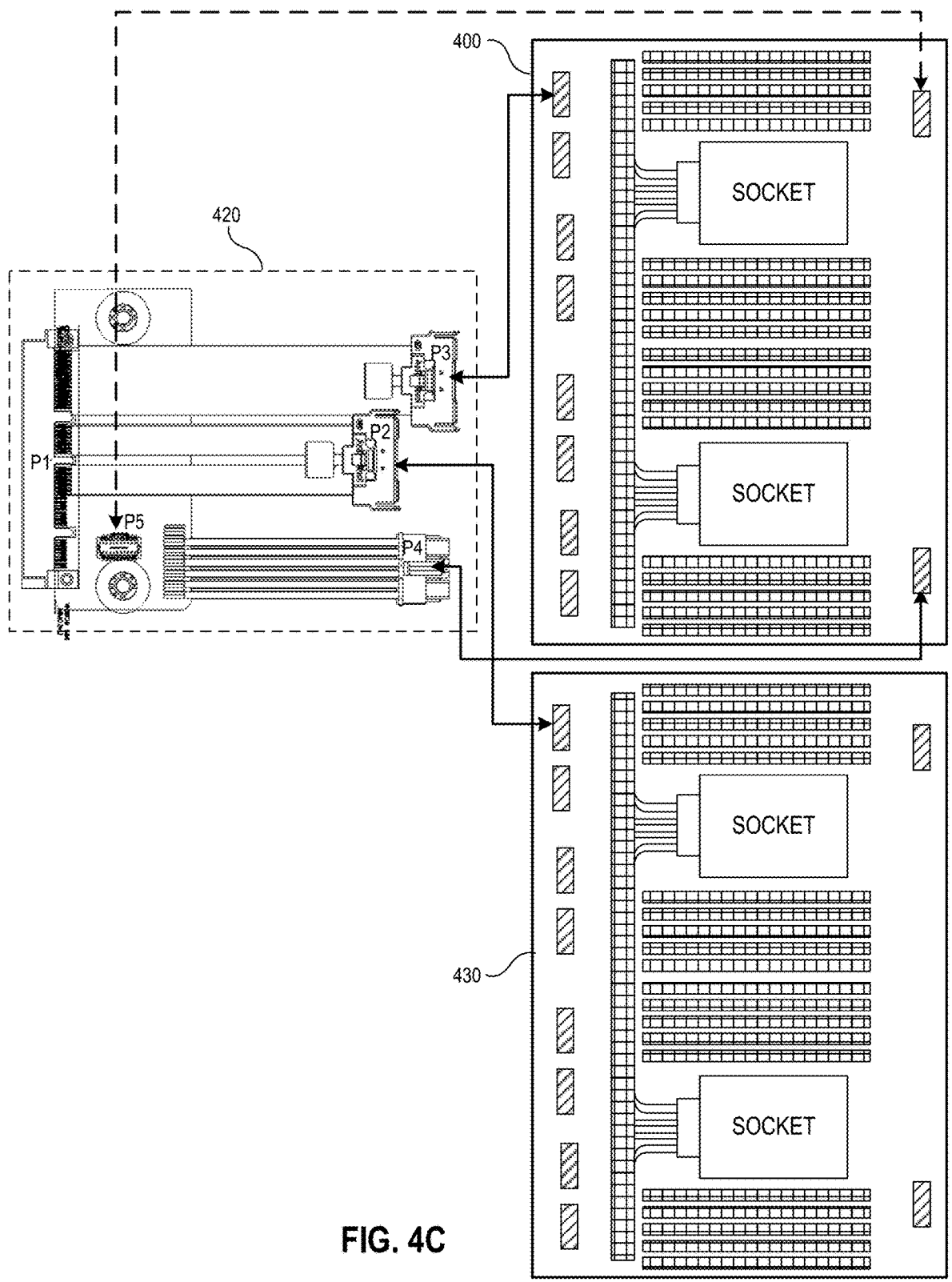
FIG. 4C illustrates an example of the coupling between the cable system and multiple server boards, according to one aspect of the instant application.

The same cable system may also provide connections between the expansion card and multiple server boards. FIG. 4C illustrates an example of the coupling between the cable system and multiple server boards, according to one aspect of the instant application. In the example shown in FIG. 4C, in addition to server board 400, cable system 420 can also be coupled to a server board 430, which can be similar to server board 400. Like the examples shown in FIGS. 4A and 4B, in FIG. 4C, connectors P3, P4, and P5 can be similarly connected to corresponding ports on server board 400. High-speed connector P3 can be connected to a high-speed data port on server board 400, low-speed connector P4 can be connected to the power and sideband management port on server board 400, and optional connector P5 can be connected, when needed, to the BMC NCSI interface (i.e., the RBT port) on server board 400. However, high-speed connector P2 is now connected to a high-speed data port on server board 430 to allow the expansion card to communicate with a processor on server board 430. This way, the same expansion card can serve processors on both server boards. FIG. 4C shows a card-to-multiple-boards cable connection scenario.

Figure 5:
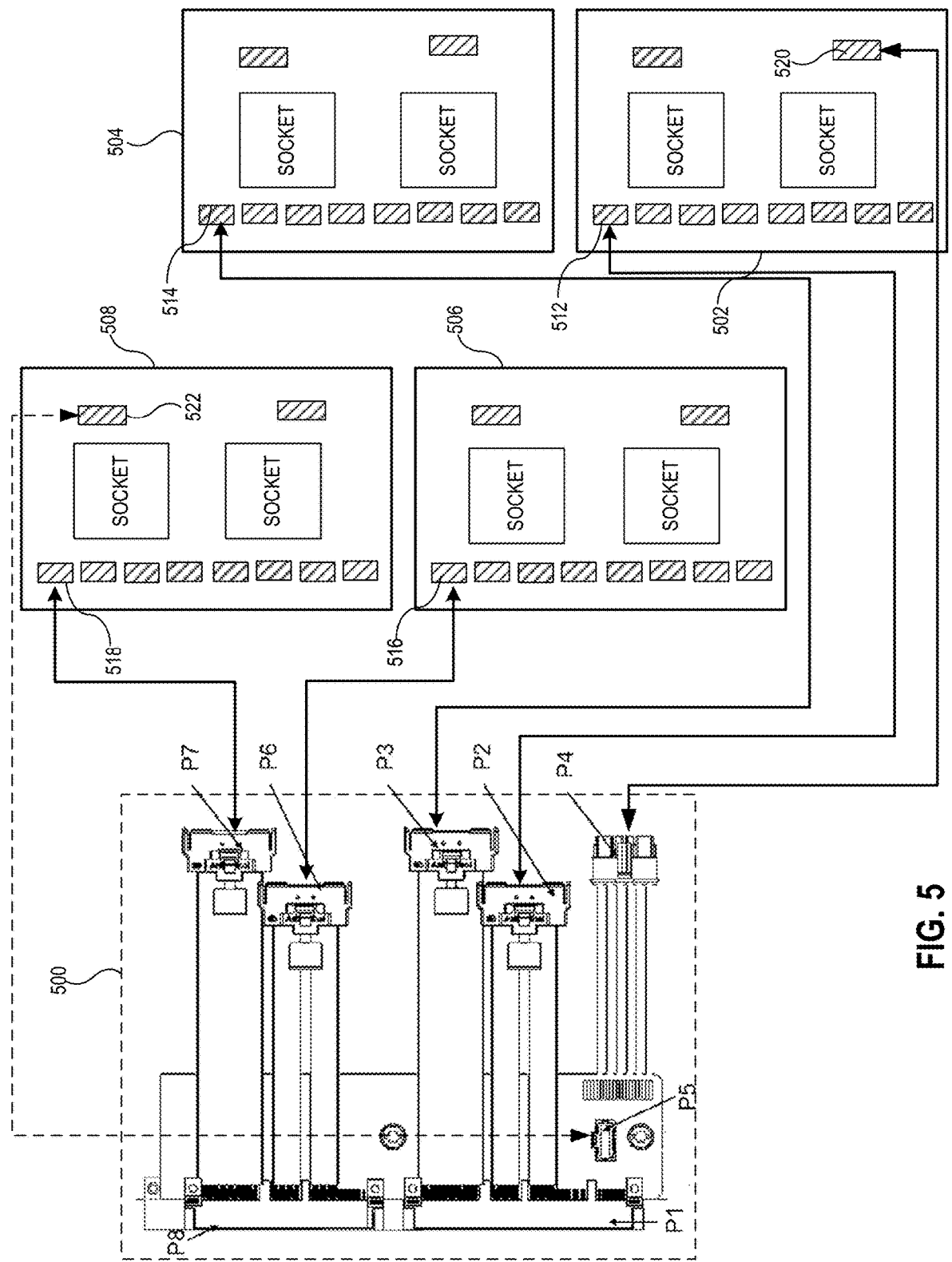
FIG. 5 illustrates an example of the coupling between a cable system compatible with the Open Compute Project (OCP) large form factor (LFF) standard and multiple server boards, according to one aspect of the instant application.

An LFF OCP card may require more connection options from the cable system. FIG. 5 illustrates an example of the coupling between a cable system compatible with the OCP LFF standard and multiple server boards, according to one aspect of the instant application. As can be seen from FIG. 5, the cable system can allow an LFF OCP card to serve up to four server boards. In FIG. 5, a cable system 500 can interface with server boards 502-508. For simplicity of illustration, each server board is shown as having a simpler structure compared with server board 400 shown in FIG. 4A. However, in practice, each server board shown in FIG. 5 can be similar to server board 400 shown in FIG. 4A, with at least a number of high-speed data ports, a power and sideband management port, and an RBT port.

Cable system 500 can be similar to cable system 300 shown in FIG. 3 and can include, on the card side, expansion card connectors P1 and P8 for interfacing with an LFF OCP card, with P1 being a 4C+ connector and P8 being a 4C connector. The corresponding edge connectors on the LFF OCP card can be inserted into the multiple slots provided by connectors P1 and P8. On the host side, cable system 500 can include high-speed connectors P2, P3, P6, and P7, with P2 and P3 coupled to P1 via corresponding high-speed cables and P6 and P7 coupled to P8 via corresponding high-speed cables. Cable system 500 can also include a low-speed connector P4 and an optional RBT connector P5.

In the example shown in FIG. 5, the four high-speed connectors of cable system 500 can each be coupled to a high-speed data port on an individual server board. P2 can be coupled to a high-speed data port 512 on server board 502, P3 can be coupled to a high-speed data port 514 on server board 504, P6 can be coupled to a high-speed data port 516 on server board 506, and P7 can be coupled to a high-speed data port 518 on server board 508. This way, cable system 500 can simultaneously couple an LFF OCP card to four different server boards. Depending on the different functions of the server boards (e.g., whether a server board is a motherboard or a mezzanine board), low-speed connector P4 and optional RBT connector P5 can be coupled to different server boards. In this example, server board 502 can be the motherboard, and P4 can be coupled to a power and sideband management port 520 on server board 502. On the other hand, optional RBT connector P5 can be coupled, when needed, to an RBT port 522 on server board 508.

Cable system 500 can provide many more different coupling options than what is shown in FIG. 5. For example, depending on the application, the four high-speed connectors (i.e., P2, P3, P6, and P7) can be coupled to different numbers of server boards. If the LFF OCP card only serves only one server board, all high-speed connectors may be coupled to the high-speed data ports on the same server board. Moreover, if the LFF OCP card serves only one processor, all high-speed connectors may be coupled to the ports on the same server board belonging to that processor. Alternatively, these high-speed connectors may be divided into a number of subsets with each subset coupled to a particular socket or different sockets on a particular server board. The number of connectors in each subset can be any number between zero and four, depending on the practical need.

Figure 6:
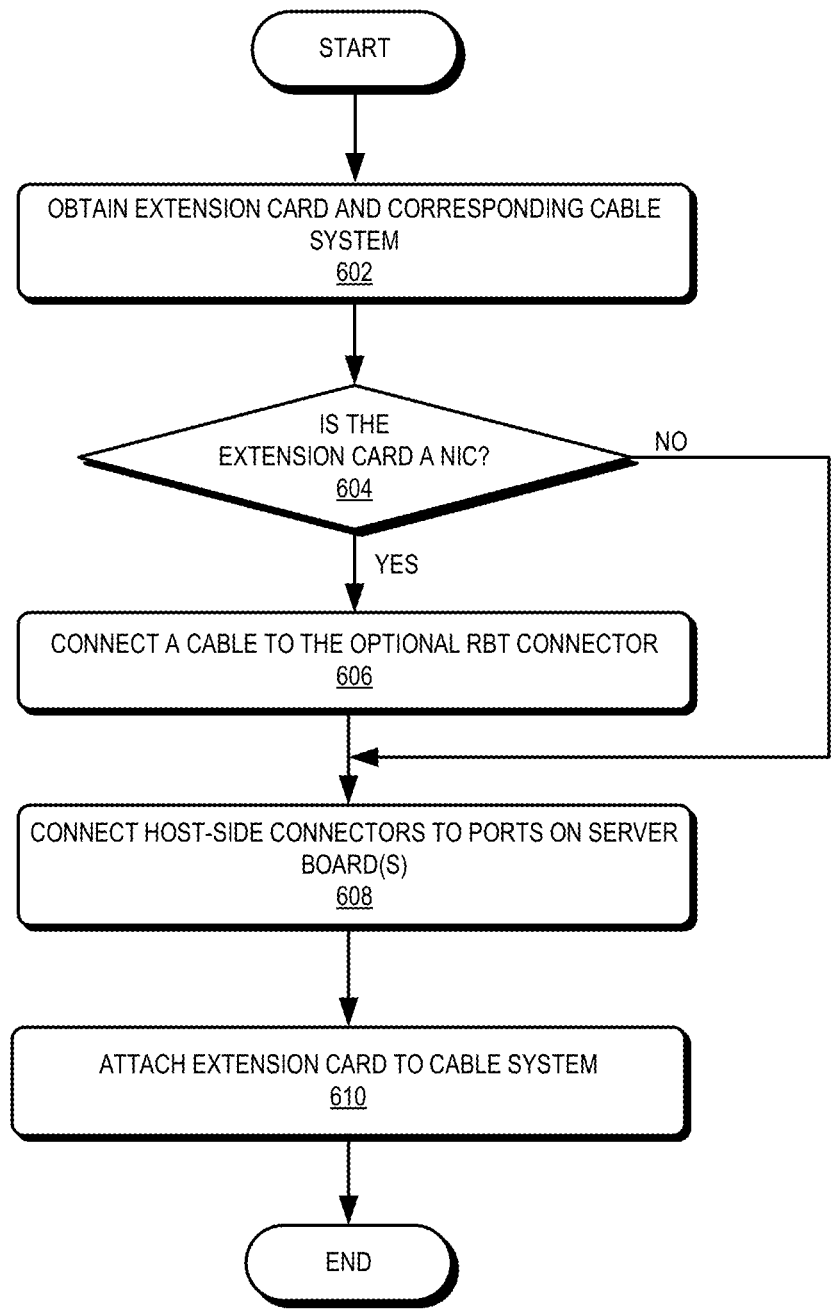
FIG. 6 presents a flowchart illustrating an example of the installation process of an expansion card, according to one aspect of the instant application.

FIG. 6 presents a flowchart illustrating an example of the installation process of an expansion card, according to one aspect of the instant application. During operation, the installer can obtain an expansion card (e.g., a card conforming to a particular form factor) and a corresponding cable system (operation 602). For example, if the expansion card conforms to the OCP SFF standard, the cable system can include a cable system similar to the one shown in FIG. 2A. If the expansion card conforms to the OCP LFF standard, the cable system can include a cable system similar to the one shown in FIG. 3.

The installer can then determine whether the expansion card is a NIC card (operation 604). In addition to a NIC card, the expansion card may be a storage controller or an accelerator (e.g., a deep learning accelerator, an encryption accelerator, etc.). If it is determined that the expansion card is a NIC, the installer can connect a cable to the optional RBT connector mounted on the PCB of the cable system (operation 606). Note that both ends of the cable can be terminated by connectors of appropriate form factors. Otherwise, the optional RBT connector on the PCB can be left unconnected.

The installer can subsequently connect the host-side connectors (e.g., the high-speed and low-speed connectors) to corresponding ports on the one or more server boards (operation 608). Note that if the optional RBT connector is connected, the host-side connectors would include the connector on the cable that is coupled to the RBT connector. Depending on the application, these host-side connectors may be coupled to different numbers of server boards. In one example, all of the host-side connectors of the cable system may be connected to the ports on one server board. In a different example, those connectors may be connected to ports on different server boards. The installer can then attach the expansion card to the cable system to complete the installation (operation 610). More specifically, the connectors (i.e., 4C+ and 4C connectors) on the edge of the expansion card can be inserted into the corresponding slots of the corresponding expansion card connector(s) (e.g., connector 202 shown in FIG. 2A or primary and secondary connectors 306 and 316 shown in FIG. 3) in the cable system.

In general, the proposed cable system can eliminate the need for custom-designed cabling solutions to support various types of expansion cards, such as storage controllers, accelerators, NICs, etc. In one example, the cable system can include, on the card side, one or more connectors conforming to the OCP NIC 3.0 specification (e.g., 4C+ or 4C connectors) for interfacing with an SFF OCP card or an LFF OCP card. On the host side, the cable system can take advantage of existing ports on server boards by organizing the contact pins of the card-side connector(s) into multiple subsets with each subset of pins coupled to a connector that can be inserted into a corresponding server port. The multiple subsets of pins and the corresponding connectors can be connected, respectively, via individual cables (e.g., ribbon cables or discrete cables) to allow the card-side connectors to be able to couple to different ports on different server boards. Moreover, to preserve the integrity of high-speed signals, the cable carrying the high-speed signals can be directly soldered onto the corresponding contact pins of the car-side connectors. To reduce cost and thermal load, the cable system can also include an optional RBT connector that is cabled up when needed (i.e., when connecting a NIC card). The cable system can further include a PCB for supporting the card-side connectors and for mounting the optional connector.

One aspect of the application can provide a cable system. The cable system can include a printed circuit board (PCB) comprising a set of connector pin pads and a card-side connector for interfacing with an expansion card, with the card-side connector comprising a connector housing and a set of pins. The connector housing is attached to the PCB, and a first subset of the set of pins is soldered on and electrically coupled to the set of connector pin pads on the PCB. The cable system can further include first and second cables electrically coupled to the card-side connector. The first cable can include a first end soldered onto the set of connector pin pads on the PCB to couple to the first subset of the set of pins of the card-side connector and a second end coupled to a first host-side connector. The second cable can include a first end soldered onto a second subset of the set of pins of the card-side connector and a second end coupled to a second host-side connector, thereby facilitating electrical coupling between the card-side connector and the first and second host-side connectors.

In a variation on this aspect, the expansion card can conform to a small form factor (SFF) defined by OCP Network Interface Card (NIC) 3.0 specification, and the card-side connector can include a 4C+ connector.

In a variation on this aspect, the first host-side connector is to be coupled to a power and sideband management port on a server board.

In a further variation, a pinout of the first host-side connector can comply with Data Center Modular Hardware System (DC-MHS) Modular Hardware System Platform Infrastructure Connectivity (M-PIC) specification.

In a variation on this aspect, the second host-side connector is to be coupled to a high-speed data port on a server board.

In a further variation, a pinout of the second host-side connector complies with Storage Networking Industry Association (SNIA) SFF-9402 specification or DC-MHS Modular Hardware System Extensible I/O (M-XIO) specification.

In a variation on this aspect, the cable system can further include an optional connector for Network Communication Services Interface (NCSI) mounted on the PCB and electrically coupled to the card-side connector.

In a further variation, the optional connector can include a Reduced Media Independent Interface (RMII)-based transport (RBT) bus connector for establishing an RBT bus connection between a Network Interface Card (NIC) and a server baseboard management controller (BMC) NCSI interface.

In a variation on this aspect, the cable system can further include a third cable electrically coupled to the card-side connector. The third cable can include a first end directly soldered onto a third subset of the set of pins of the card-side connector and a second end coupled to a third host-side connector.

In a further variation, the second and third host-side connectors are to be coupled to high-speed data ports on a same server board.

In a further variation, the second and third host-side connectors are to be coupled to high-speed data ports on different server boards.

In a further variation, the expansion card conforms to a large form factor (LFF) defined by OCP Network Interface Card (NIC) 3.0 specification, and the OCP card-side connector comprises a 4C+ connector and a 4C connector.

In a further variation, the first, second, and third cables can be electrically coupled to the 4C+ connector.

In a further variation, the cable system can further include fourth and fifth cables electrically coupled to the 4C connector, and the fourth and fifth cables are to be coupled to high-speed data ports on one or more server boards.

One aspect of the application can provide a server system. The server system can include an expansion card, one or more server boards, and a cable system for coupling the expansion card to the one or more server boards. The cable system can include a printed circuit board (PCB) comprising a set of connector pin pads and a card-side connector comprising a connector housing and a set of pins. The connector housing is attached to the PCB, and a first subset of the set of pins is soldered on and electrically coupled to the set of connector pin pads on the PCB. The cable system can further include first and second cables electrically coupled to the card-side connector. The first cable can include a first end soldered onto the set of connector pin pads on the PCB to couple to the first subset of the set of pins of the card-side connector and a second end coupled to a first host-side connector. The second cable can include a first end soldered onto a second subset of the set of pins of the card-side connector and a second end coupled to a second host-side connector.

The above description is presented to enable any person skilled in the art to make and use the examples and is provided in the context of a particular application and its requirements. Various modifications to the disclosed examples will be readily apparent to those skilled in the art, and the general principles defined herein may be applied to other implementations and applications without departing from the spirit and scope of the present disclosure. Thus, the scope of the present disclosure is not limited to the examples shown but is to be accorded the widest scope consistent with the principles and features disclosed herein.

The foregoing descriptions of examples have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A cable system comprising:
    a printed circuit board (PCB) comprising a set of connector pin pads;
    a card-side connector for interfacing with an expansion card, wherein the card-side connector comprises a connector housing and a set of pins, wherein the connector housing is attached to the PCB, and wherein a first subset of the set of pins is soldered on and electrically coupled to the set of connector pin pads on the PCB; and
    first and second cables electrically coupled to the card-side connector,
        wherein the first cable comprises a first end soldered onto the set of connector pin pads on the PCB to couple to the first subset of the set of pins of the card-side connector and a second end coupled to a first host-side connector, and
        wherein the second cable comprises a first end soldered onto a second subset of the set of pins of the card-side connector and a second end coupled to a second host-side connector, thereby facilitating electrical coupling between the card-side connector and the first and second host-side connectors.

2. The cable system of claim 1, wherein the expansion card conforms to a small form factor (SFF) defined by Open Compute Project (OCP) Network Interface Card (NIC) 3.0 specification, and wherein the card-side connector comprises a 4C+ connector.

3. The cable system of claim 1, wherein the first host-side connector is to be coupled to a power and sideband management port on a server board.

4. The cable system of claim 3, wherein a pinout of the first host-side connector complies with Data center Modular Hardware System (DC-MHS) Modular Hardware System Platform Infrastructure Connectivity (M-PIC) specification.

5. The cable system of claim 1, wherein the second host-side connector is to be coupled to a high-speed data port on a server board.

6. The cable system of claim 5, wherein a pinout of the second host-side connector complies with Storage Networking Industry Association (SNIA) SFF-9402 specification or DC-MHS Modular Hardware System Extensible I/O (M-XIO) specification.

7. The cable system of claim 1, further comprising an optional connector for Network Communication Services Interface (NCSI) mounted on the PCB and electrically coupled to the card-side connector.

8. The cable system of claim 7, wherein the optional connector comprises a Reduced Media Independent Interface (RMII)-based transport (RBT) bus connector for establishing an RBT bus connection between an OCP Network Interface Card (NIC) and a server baseboard management controller (BMC) NCSI interface.

9. The cable system of claim 1, further comprising a third cable electrically coupled to the card-side connector, wherein the third cable comprises a first end directly soldered onto a third subset of the set of pins of the card-side connector and a second end coupled to a third host-side connector.

10. The cable system of claim 9, wherein the second and third host-side connectors are to be coupled to high-speed data ports on a same server board.

11. The cable system of claim 9, wherein the second and third host-side connectors are to be coupled to high-speed data ports on different server boards.

12. The cable system of claim 9, wherein the expansion card conforms to a large form factor (LFF) defined by OCP Network Interface Card (NIC) 3.0 specification, and wherein the card-side connector comprises a 4C+ connector and a 4C connector.

13. The cable system of claim 12, wherein the first, second, and third cables are electrically coupled to the 4C+ connector.

14. The cable system of claim 12, further comprising fourth and fifth cables electrically coupled to the 4C connector, wherein the fourth and fifth cables are to be coupled to high-speed data ports on one or more server boards.

15. A server system comprising:
an expansion card;
one or more server boards; and
a cable system for coupling the expansion card to the one or more server boards, wherein the cable system comprises:
a printed circuit board (PCB) comprising a set of connector pin pads;
a card-side connector comprising a connector housing and a set of pins, wherein the connector housing is attached to the PCB, and wherein a first subset of the set of pins is soldered on and electrically coupled to the set of connector pin pads on the PCB; and
first and second cables electrically coupled to the card-side connector,
wherein the first cable comprises a first end soldered onto the set of connector pin pads on the PCB to couple to the first subset of the set of pins of the card-side connector and a second end coupled to a first host-side connector, and
wherein the second cable comprises a first end soldered onto a second subset of the set of pins of the card-side connector and a second end coupled to a second host-side connector.

16. The server system of claim 15, wherein the first host-side connector is to be coupled to a power and sideband management port on a server board.

17. The server system of claim 15, further comprising a third cable electrically coupled to the card-side connector, wherein the third cable comprises a first end directly soldered onto a third subset of the set of pins of the card-side connector and a second end coupled to a third host-side connector.

18. The server system of claim 17, wherein the second and third host-side connectors are to be coupled to high-speed data ports on a same server board.

19. The server system of claim 17, wherein the second and third host-side connectors are to be coupled to high-speed data ports on different server boards.

20. The server system of claim 15, further comprising an optional connector for Network Communication Services Interface (NCSI) mounted on the PCB and electrically coupled to the card-side connector, wherein the optional connector comprises a Reduced Media Independent Interface (RMII)-based transport (RBT) bus connector for establishing an RBT bus connection between a Network Interface Card (NIC) and a server baseboard management controller (BMC) NCSI interface.

* * * * *